United States Patent [19]

Colman et al.

[11] Patent Number: 5,001,537

[45] Date of Patent: Mar. 19, 1991

[54] SEMICONDUCTOR DEVICE FOR ELECTRICAL OVERSTRESS PROTECTION

[75] Inventors: Derek Colman; Vijay K. Pathak, both of Bedford, United Kingdom

[73] Assignee: Texas Instruments Incorporated, Dallas, Tex.

[21] Appl. No.: 204,133

[22] Filed: Jun. 8, 1988

[30] Foreign Application Priority Data

Jun. 9, 1987 [GB] United Kingdom ............... 8713440

[51] Int. Cl.$^5$ ........................................ H01L 29/74
[52] U.S. Cl. ........................................ 357/38; 357/13; 357/20; 357/86
[58] Field of Search ............ 357/38(U.S. only), 38 E, 357/38 C, 38 G, 38 S, 38 T, 38 P, 38, 13, 20, 37, 86

[56] References Cited

U.S. PATENT DOCUMENTS

| | | |
|---|---|---|
| 3,152,928 | 10/1964 | Hubner . |
| 4,275,408 | 6/1981 | Yukimoto ............... 357/38 |
| 4,509,089 | 4/1985 | Svedberg ............... 357/38 |
| 4,574,296 | 3/1986 | Sueoka et al. ........... 357/13 |

FOREIGN PATENT DOCUMENTS 54-73585 6/1979 Japan .
54-120588 9/1979 Japan .

Primary Examiner—Andrew J. James
Assistant Examiner—Sara W. Crane
Attorney, Agent, or Firm—Gary C. Honeycutt; Melvin Sharp; N. Rhys Merrett

[57] ABSTRACT

A voltage overstress protection device consists of a four-layer diode having a buried region of higher impurity concentration adjacent the central junction of the device. The buried region is divided into a plurality of small regions to ensure an even distribution of energy dissipation across the structure. The cathode of the device may be perforated by shorting dots of the material of the second layer to determine the holding current of the device, and where this is done the small buried regions are aligned with parts of the cathode and not with the shorting dots. Two devices may be formed in opposite senses in the same body of semiconductor material and connected together in antiparallel to provide protection against voltage surges of either polarity. Two antiparallel pairs of devices may be formed in a single semiconductor body to provide protection against separate voltage surges on two lines and also against different voltage surges between the two lines.

4 Claims, 1 Drawing Sheet

SEMICONDUCTOR DEVICE FOR ELECTRICAL OVERSTRESS PROTECTION

BACKGROUND OF THE INVENTION

1. Field of the Invention

This invention relates to a semiconductor device for providing electrical overstress protection in particular by shorting to ground excessively high voltage transients.

2. Brief Description of the Prior Art

Semiconductors are becoming widely used in modern telephone systems which has radically altered the need for protection against overvoltage transients caused by, for instance, lightning strikes. At the subscriber line interface in a telephone exchange, protection is conventionally provided by semiconductor secondary protectors which can withstand voltages up to 2 kV. These protectors capture the residual overvoltage stress which has been let through by the primary protectors. On the main distribution function (MDF) of the exchange, extremely high energy dissipation requirements have so far precluded the use of a semiconductor device for primary protection. This requirement is generally met by gas discharge tubes which initially clip the voltage transients at approximately 600-700 V and eventually switch to a low resistance mode. Although these devices are capable of absorbing high energies, their protection characteristics deteriorate with time and more of the overvoltage stress is allowed through to the subscriber line interface.

A semiconductor transient suppressor structure is described in UK Patent No. 2,113,907. It is a thyristor type structure with a controlled holding current and an additional n-layer through which reverse breakdown of the central junction of the structure takes place to control the initial avalanche breakover voltage. The controlled holding current of this type of suppressor may result from the provision of an array of shorting dots of gate electrode material perforating the cathode so as to join the cathode resistively to the gate. In an avalanche structure, the breakdown always starts at localized sites called microplasmas. The localized high voltage gradients set up due to these microplasmas are primarily responsible for the conduction spread during the breakdown period (This effect is different from the more conventional plasma spreading during the post turn on phase.). As the breakdown current increase, the microplasma area increases until a critical current density is reached where the device latches on regeneratively and the voltage collapses to a low value.

In the structure described in the above patent the turn on tends to start in a limited area where the energy dissipation can be very high and conduction spreads only relatively slowly across the whole structure. During this turn on phase the energy dissipation in the limited area can become sufficiently high to cause destruction of the device. This is clearly a disadvantage.

SUMMARY OF THE INVENTION

It is an object of the present invention to provide an improved semiconductor device for providing overstress protection in which the above disadvantage is substantially avoided.

According to the present invention there is provided a semiconductor device having a PN junction between first and second regions of the device in which, in the intended operation of the device reverse breakdown of the junction occurs, the first region being of lower impurity concentration than the second region, and in the first region adjacent to the junction there is provided a buried region of the same conductivity type as and of higher impurity concentration than the first region so that reverse breakdown of the junction preferentially occurs through the buried region, characterised in that the buried region is divided into a plurality of separate regions of small area, thereby to cause the reverse breakdown current to be distributed substantially evenly over the area of the junction.

The semiconductor device may have a four-layer or thyristor type structure and may include an array of shorting dots joining the gate to the adjacent end terminal so as to provide the device with a controlled holding current. The small areas of the buried region should be aligned with the part of the cathode between the shorting dots.

To maximize the surge capability of a suppressor of this type it is important to maximise the conduction area at turn on and to achieve as uniform an energy dissipation as possible across the structure.

The effect of dividing the buried region into a plurality of separate regions is to reduce the crosssectional area for breakdown which produces a higher slope resistance across the junction. In an avalanche, structure breakdown always starts at localized sites called microplasmas, and the higher slope resistance across the junction limits the ability of the microplasma in one small area region to rise to the level at which breakdown occurs until the microplasmas in the other small area regions are also close to breakdown. Although the small area regions may not break down simultaneously, the fact that the microplasma in each of the small area regions is close to breakdown means that the energy dissipation of the device and therefore its ability to withstand surges is higher than those of otherwise similar devices in which the buried region is continuous.

Two semiconductor devices may be fabricated in the same semiconductor body so as to be connected in parallel but in opposite senses, so as to break down in response to an overload voltage of either polarity.

Protection devices may be constructed using two symmetrical devices in the same semiconductor body. Devices having different breakdown characteristics can be produced by changing the isolation between the devices.

BRIEF DESCRIPTION OF THE DRAWINGS

In order that the invention may be fully understood and readily carried into effect an example of it will now be described with reference to the accompanying drawings, of which.

DESCRIPTION OF THE PREFERRED EMBODIMENTS

Figure 1:
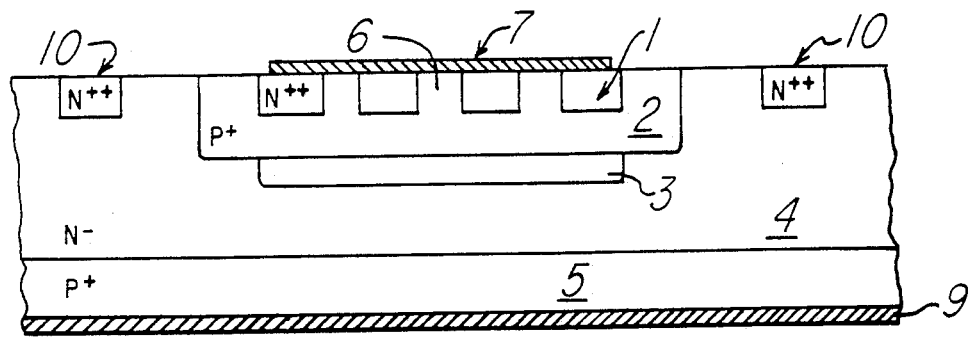
FIG. 1 shows in diagrammatic form an example of a unidirectional suppressor as disclosed in British Patent No. 2,113,907.

The suppressor shown in FIG. 1 has a cathode region 1 of highly doped n-type conductivity in a gate region 2 of somewhat less highly doped, but still heavily doped p-type conductivity. In accordance with the invention described in British Patent No. 2,113,907 a heavily doped buried region 3 of n-type conductivity is formed beneath the gate region 2 at the junction of that region and a lightly doped region 4 of n-type conductivity forming the bulk of the device. An anode region 5 of heavily doped p-type conductivity is located on the underside of the region 4. The cathode region 1 is penetrated by a plurality of small area shorting dots 6 of the material of the gate region 2 distributed over the area of the the junction between the cathode region 1 and the gate region 2 to provide a resistive connection across that junction thereby to give the device a relatively high but controlled holding current. Cathode and anode contacts 7 and 9 are provided, no external connection to the gate 2 being required. The small regions 10 of highly doped n-type conductivity formed in the upper surface of the region 3 away from the cathode 1 and gate 2 are provided to prevent inversion at that surface.

Figure 2:
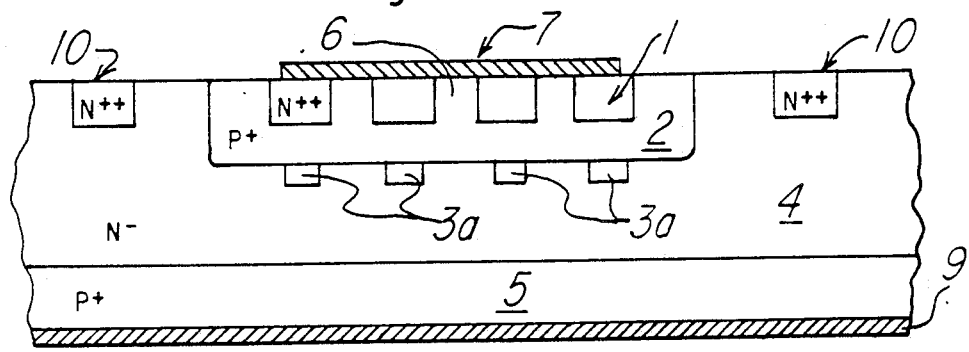
FIG. 2 shows in diagrammatic form an example of the present invention.

FIG. 2 shows an example of the invention using the same references as were used in FIG. 1 for the same components of the structure. It can be seen that the single buried region 3 of FIG. 1 is divided into a plurality of separate small regions 3A in FIG. 2. Note that the regions 3A are aligned with the parts of the cathode. This change in the structure is designed to force a more uniformly distributed turn on within the device and hence a much improved protection capability for a given size of structure. The principle of the invention is to break up the buried layer (3) into an array of not necessarily circular dots under parts of the cathode gate junction The effective cross sectional area for breakdown is reduced by this change in the buried layer, giving a higher slope resistance which in turn limits the ability of a given microplasma to rise to the turn on level until the conduction has spread in each dot to a level which is also close to the turn on point, Although the separate regions 3A may not turn on simultaneously, the fact that the microplasma spread in each of the dots is on average at a much more advanced state when breakdown starts compared to that of the different parts of the single buried region shown in FIG. 1 means that the energy dissipation is more uniformly distributed and hence the surge capability of the device is much improved.

Keeping every other parameter constant it has been found that the use of a dot structure for the buried region can give a factor of two improvement in surge capability of the device. Experimental evaluation units with a single buried region achieved a mean surge current capability of 433A (ANSI spec. 8/20 waveform), while those with a buried region divided into an array of 20 dots each of 0.004 inches diameter achieved a mean surge current capability of 853A.

Due to the higher slope resistance of the dot structured buried region, the breakover voltages of the devices have been found to be slightly higher. This may be disadvantageous for secondary protection applications. However the dynamic breakover voltage overshoots are typically only 70 V for a 90 V device and, for use as a primary protector where the gas discharge tube is normally used, it compares favorably with voltage overshoots (of typically 4–500 V) which such tubes usually have.

The buried regions 3A are produced by diffusion of n-type dopant from the upper surface of the body 4. Afterwards the region 2 is produced by a shallower diffusion of p-type dopant of such concentration that it overdopes all but the tips of the more heavily doped n-type region, leaving these as the separate small regions 3A. The cathode region 1 is then produced in the region 2 by a further diffusion operation.

Although the device described above has an $n^-$ conductivity type body 4 with regions 2 and 5 of $p^+$ conductivity type and a region 1 of $n^{++}$ conductivity type, the conductivity types of the body and the various regions could be reversed to produce a device which breaks over in response to overload voltages of the opposite polarity.

Two devices may be formed in the same semiconductor body so as to be connected in parallel but in opposite senses, thereby providing a structure which breaks over in response to an overload voltage of either polarity. Two structures of this kind based on the device described above with reference to FIG. 2 are shown in diagrammatic cross-section in FIG. 3.

Figure 3:
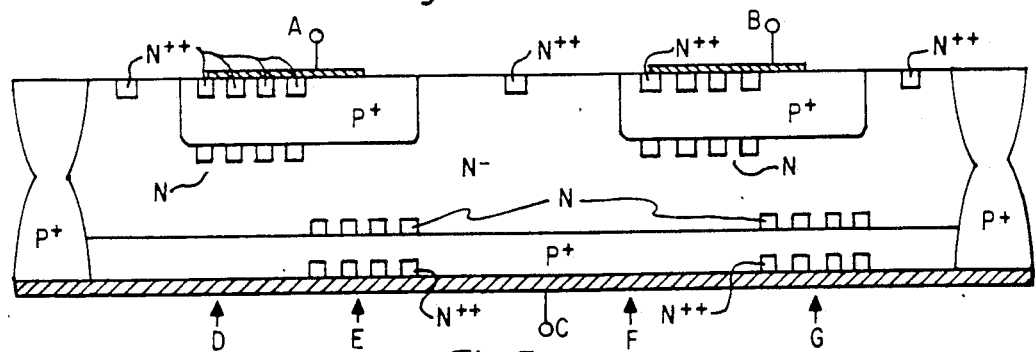
FIG. 3 shows in diagrammatic form a protection device using two pairs of suppressors of the kind shown in FIG. 2 formed in the same semiconductor body.

FIG. 3 shows a protection device using two pairs of devices of the type shown in FIG. 2. The four devices are indicated by the letters D, E, F and G. The devices D and F are exactly as shown in FIG. 2, but the devices E and G are inverted with their cathode regions at the lower face of the device. Each pair of devices D and E and F and G are connected in parallel with each other, the devices D and E being joined together by a metallization on the upper surface of the devices connected to the terminal A and a metallization over the whole of the lower surface of the device connected to a terminal C. Similarly, the devices F and G are connected in parallel between a terminal B and the terminal C.

Each pair of semiconductor devices operates as described above with reference to FIG. 2 in respect of voltages of both polarities between the terminal A or B and the terminal C. It is not necessary for the breakdown voltage characteristics for both devices in a pair to be exactly the same.

The structure shown in FIG. 3 has the property additional to that provided by the two pairs of devices because the upper parts of the pairs of devices can operate together through the bulk of the structure in a lateral direction. This means that the structure shown in FIG. 3 cannot only provide overvoltage protection at the terminals A and B relative to the teminal C but it does also provide overvoltage protection between the terminals A and B. The breakover characteristics between the terminals A and B will be substantially the same as those between A and C and between B and C.

Figure 4:
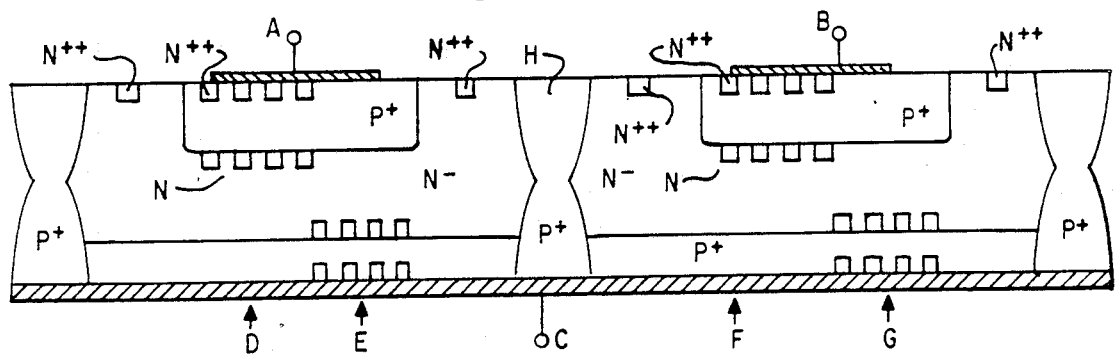
FIG. 4 shows a modification of the device shown in FIG. 3 in which isolation is provided between the two pairs of suppressors.

FIG. 4 shows a modification of the structure shown in FIG. 3 in which the two pairs D and E and F and G of semiconductor devices are isolated from one another by the provision of an additional $p^+$ region H. In FIG. 4, the pairs of devices operate to provide protection against excessive voltages of both polarities between the terminals A and C and between the terminals B and C. The isolation region H eliminates the lateral coupling between the upper parts of the two pairs of devices so that the breakover voltage between the terminals A and B is equal to substantially twice that between terminals A and C or between terminals B and C.

The structures shown in FIGS. 3 and 4 may of course be produced with semiconductor material of the opposite conductivity types from those shown.

What we claim is:

1. A semiconductor device having a PN junction between first and second regions of the device in which in the intended operation of the device reverse breakdown of the junction occurs, the first region being of lower impurity concentration than the second region, and in the first region adjacent to the junction there is provided a buried region of the same conductivity type as and of higher impurity concentration than the first region so that reverse breakdown of the junction preferentially occurs through the buried region, characterized in that the buried region is divided into a plurality of separate regions of small area thereby to cause the reverse breakdown current to be distributed substantially evenly over the area of the junction, said device having a four-layer structure, wherein the buried region is adjacent to the central PN junction of the device, in which an end region of the device is perforated at distributed small portions by the material of the region adjacent to the end region and contact metallisation is provided on the outer surface of the end region so that it connects the material in the small portions in parallel with the PN junction between the end region and the region adjacent to it, wherein the small area regions of the buried region are aligned with parts of the end region between the small portions which perforate it.

2. A semiconductor device which comprises:
   (a) first, second, third, and fourth semiconductor regions of alternating conductivity types, forming first, second and third PN junctions, said first region having a lower impurity concentration than said second region;
   (b) wherein said first PN junction formed between said first and second regions is intended to undergo reverse breakdown in normal operation;
   (c) a buried zone in said first region, of the same conductivity type as said first region, and having a higher impurity concentration than said first region, adjacent said first PN junction, such that reverse breakdown occurs preferentially through the buried zone;
   (d) said buried zone consisting of a plurality of separate sub-zones, whereby the reverse breakdown current is distributed substantially evenly over the area of the junction;
   (e) wherein an end region of said device includes at distributed spaced apart small area portions thereof material of the same conductivity type as the region adjacent to said end region, said device further including contact metallization on the outer surface of said end region connecting said material in said small portions in parallel with the PN junction between said end region and the region adjacent thereto, each of said small area regions of said buried region being aligned with a said small area portion of said end region.

3. A semiconductor device according to claim 2 wherein the separate regions of small size into which the buried region is divided are each of predetermined size and impurity concentration to produce a higher slope resistance across the junction and limit the ability of the microplasm in any one of the separate regions to rise to the level at which breakdown occurs until the microplasm in the other separate regions are also close to breakdown.

4. A voltage overstress protection device including two semiconductor devices according to claim 2 disposed in the same body of semiconductor material, one said semiconductor device being disposed in one sense between the major surfaces of the body and the other semiconductor device being disposed in the opposite sense between the surfaces, and metallization disposed on said device connecting said two semiconductor devices in parallel, the device providing overstress protection against voltage of either polarity.

* * * * *